United States Patent [19]

Iwazawa et al.

[11] Patent Number: 5,155,557
[45] Date of Patent: Oct. 13, 1992

[54] OPTICAL ALIGNMENT DETECTION APPARATUS

[75] Inventors: Toshiyuki Iwazawa; Masaki Yamamoto, both of Tokyo; Yoshihito Nakanishi; Takeo Sato, both of Kawasaki, all of Japan

[73] Assignee: Matsushita Electric Industrial Co., Ltd., Osaka, Japan

[21] Appl. No.: 718,282

[22] Filed: Jun. 20, 1991

[30] Foreign Application Priority Data

Jun. 22, 1990 [JP] Japan .................. 2-164717

[51] Int. Cl.⁵ .............................................. G01B 11/27
[52] U.S. Cl. ............................................. 356/401; 250/548
[58] Field of Search ..................... 356/399, 400, 401; 250/548

[56] References Cited

U.S. PATENT DOCUMENTS

| 3,943,359 | 3/1976 | Matsumoto et al. | 356/400 |
| 4,531,060 | 7/1985 | Suwa et al. | 250/548 |
| 4,780,616 | 10/1988 | Nishi et al. | 250/548 |
| 4,814,829 | 3/1989 | Kosugi et al. | 355/53 |

FOREIGN PATENT DOCUMENTS

340443 11/1989 European Pat. Off.
2090411 7/1982 United Kingdom.

Primary Examiner—F. L. Evans
Attorney, Agent, or Firm—Pollock, VandeSande & Priddy

[57] ABSTRACT

An alignment detection apparatus for detecting the alignment of a superfine exposure system including an interrupted emission light source. The apparatus is equipped with an output variation monitoring sensor to detect an output variation of the light source and further a photoelectric conversion device to perform the photoelectric conversion of the alignment light to generate discrete photoelectric conversion signals. Also included in the apparatus is an integration and hold circuit to integrate and peak-hold each of the photoelectric conversion signals. This peak-hold values are corrected on the basis of the detected light-source output variation due to the monitoring sensor to output stepwise continuous signals from which a harmonic component is removed by a filter so as to obtain a smooth analog waveform. This analog waveform is processed by a phase detector. The output of the phase detector allows an accurate alignment irrespective of using the interrupted emission light source.

12 Claims, 7 Drawing Sheets

⇓ INTEGRATION & PEAK HOLD

FIG. 6(c)

⇓ CORRECTION

FIG. 6(d)

⇓ FILTERING

OPTICAL ALIGNMENT DETECTION APPARATUS

BACKGROUND OF THE INVENTION

The present invention relates generally to alignment detection apparatus, and more particularly to an apparatus for optically detecting the alignment of a substrate such as a reticle in reduction projection aligners for superfinely machining a semiconductor wafer or the like.

As an alignment detection apparatus to be used in reduction projection aligners including a mercury lamp acting as a continuous emission source, there is conventionally known an apparatus with an arrangement as disclosed in the Japanese Patent Provisional Publication No. 53-77009. This conventional alignment detection apparatus will be described hereinbelow with reference to FIG. 1. Although the alignment is effected with respect to three axes, i.e., the X- and Y-axes of the orthogonal directions and the θ-axis of the rotational direction, the description will be made only in terms of the alignment of the reticle in the X-axis direction. In the case of the requirement of the alignment accuracy, it is preferable that the exposure wavelength is coincident with the wavelength of the light to be used for the alignment.

Figure 1:
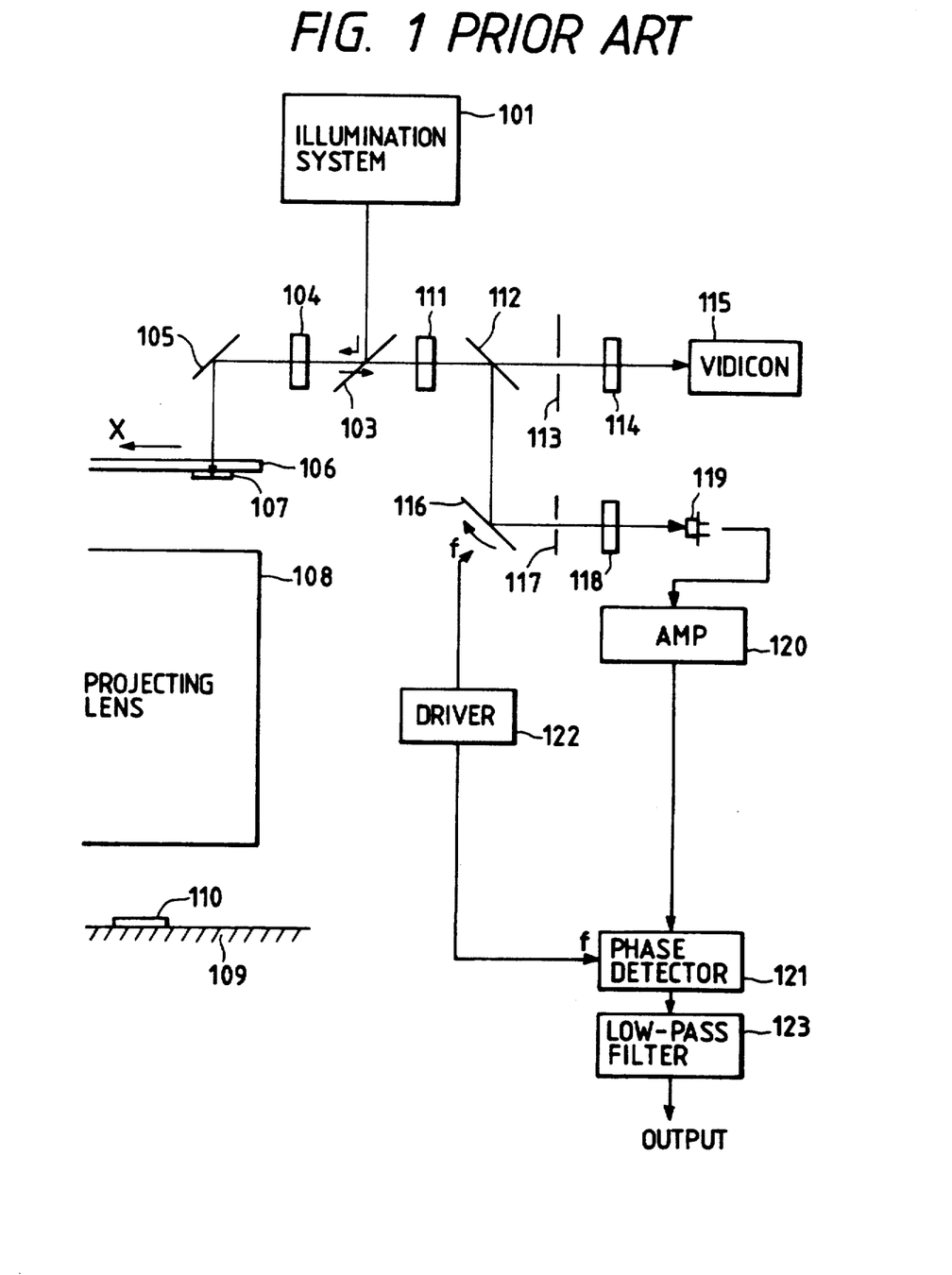
FIG. 1 is an illustration of an arrangement of a conventional alignment detection apparatus including a continuous emission light source.
Figure 2:
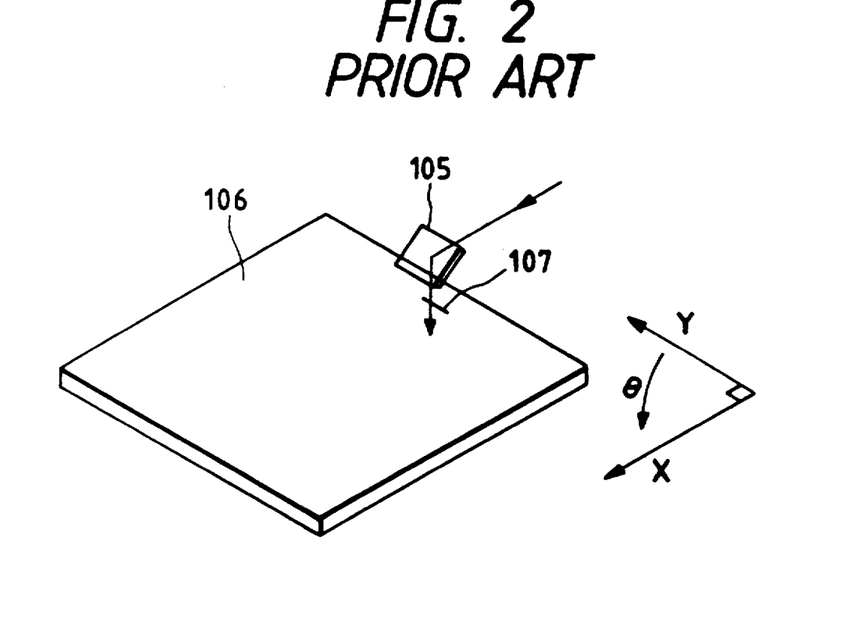
FIG. 2 a perspective view showing a reticle to be used in a projection aligner.
Figure 3:
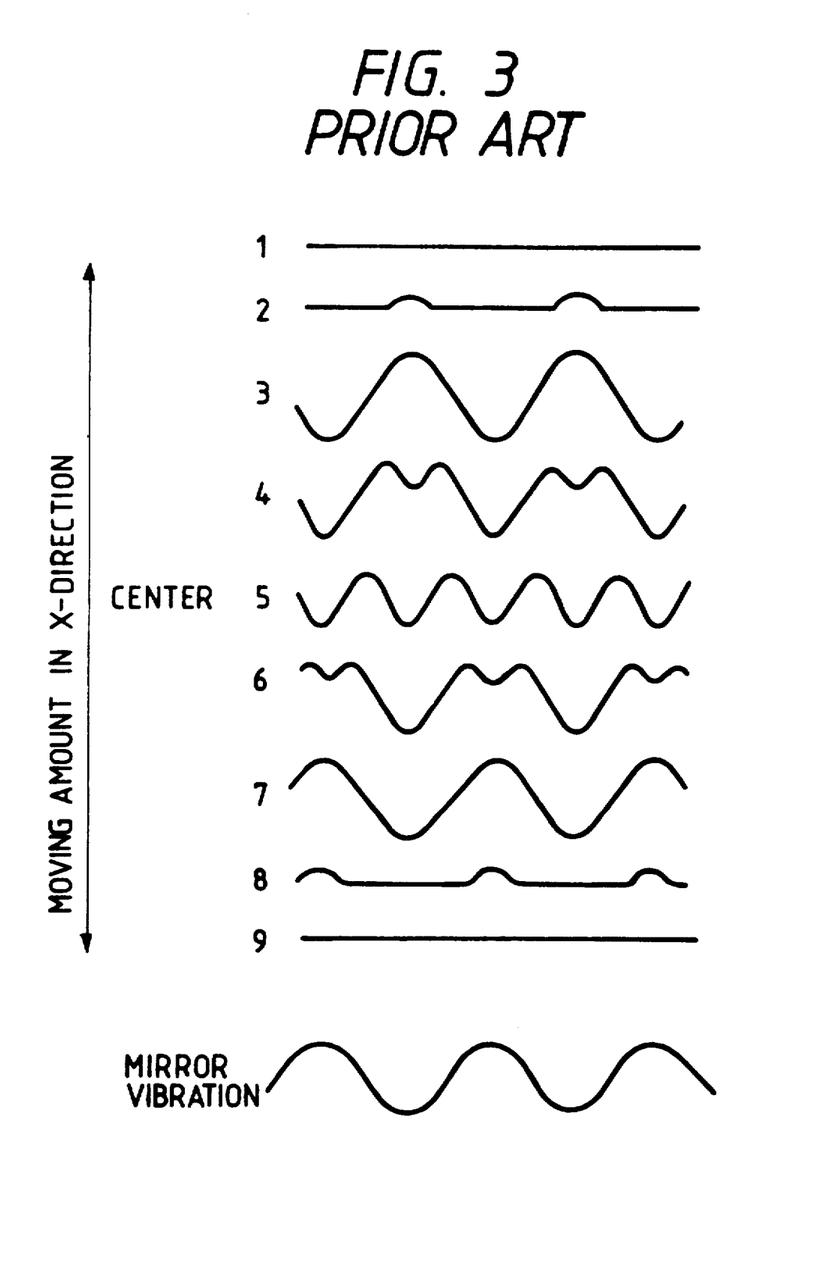
FIG. 3 is an illustration of photoelectric conversion signals to be obtained in the reticle alignment performed by using a continuous emission light source.

In FIG. 1, illustrated at numeral 101 is an illumination optical system for flow-dividing light emitted from a mercury lamp acting as an exposure light source. The light from the illumination optical system 101 is reflected by a beam-splitter 103 toward an objective lens 104 side. After being passed through the objective lens 104, the light is reflected by a mirror 105 and then incident on a reticle 106. As illustrated in FIG. 2, the reticule 106 is arranged to be movable in a plane in the X- and Y-directions which are orthogonal to each other and further in the θ-direction which is the rotational direction so as to permit a fine alignment. At the portion on which the light reflected by the mirror 105 is incident there is provided a stripe-like alignment mark 107 (here, for the X-direction). The light incident on the reticle 106 is reflected by the alignment mark 107 so as to return the same path to advance to the mirror 105, objective lens 104 and the beam splitter 103. In this case, this light straightforwardly passes through the beam splitter 103 to reach an imaging lens 111. After being passed through the imaging lens 111, the light is separated by a beam splitter 112 into a straight-advancing light beam and a reflected light beam. The straight-advancing light beam passes through a target mark 113 and relay lens 114 so as to reach a vidicon 115 for the rough alignment. On the other hand, the reflected light beam from the beam splitter 112 is reflected by a vibration mirror 116 arranged to vibrate at a given frequency f. After being reflected thereby, the reflected light beam passes through a stripe-like target mark 117 and further passes through a condensing lens 118 so as to reach a light-receiving element (for example, photomultiplier) 119. An electric signal converted in the light-receiving element 119 is amplified by an amplifier 120 and the amplified signal varies as shown (1) to (9) in FIG. 3 with respect to the mirror vibration frequency in accordance with the moving amount (shifting amount) of the reticule 106 in the X-direction. Further, the amplified signal is inputted to a phase detector 121. To this phase detector 121 there is also supplied a signal with the reference frequency f from a mirror driver 122 which is a drive circuit for the vibration mirror 116. The phase detector 121 outputs a signal representative of the product of the inputted two signals. The output signal of the phase detector 121 is led to a low-pass filter 123 for averaging and is derived as a phase detection output.

Figure 4:
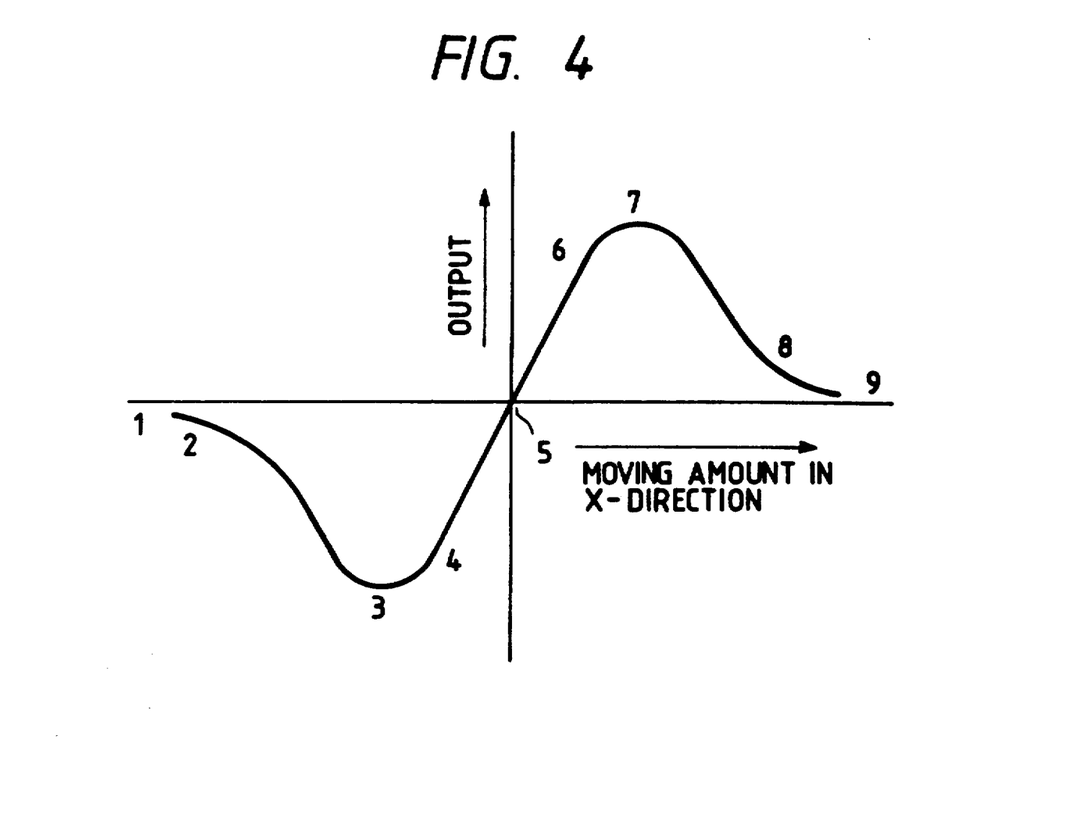
FIG. 4 is a graphic diagram showing the relation between the reticle moving amount and the detection output.

FIG. 4 shows the relation between the moving amount of the reticle in the X-direction taken on the horizontal axis and the phase detection output taken on the vertical axis, where at the vicinity of the origin there is presented the most adequate alignment state.

Now, in order to meet the recent great requirement for high integration of simiconductor elements, it is required to shorten the wavelength of the exposure light, that is, it is required to use a KrF excimer laser (wavelength $\lambda = 248$ nm) or the like in place of the g-rays, i-rays. However, although the g- and i-rays can provide stable continuous waves, the KrF excimer laser offers an interrupted wave having the pulse width of 20 ns, the repeat frequency of 200 Hz and the output variation of ± about 5%, for example. Thus, there is a problem that difficulty is encountered to use this laser light for the conventional alignment detection apparatus arranged to use the continuous wave.

SUMMARY OF THE INVENTION

It is therefore an object of the present invention to provide an alignment detection apparatus which is capable of adequately performing the alignment detection even in the case of using the interrupted wave such as the KrF excimer laser light.

In accordance with the present invention, there is provided an alignment detection apparatus for detecting the alignement of an object, comprising: a light source for periodically and interruptedly emitting light, the output of the light source varying in a predetermined range; an alignment mark provided on the object; a lens system for at least imaging light incident on the alignment mark after emitted from the light source; slit means provided substantially at the imaging position of the lens system; displacing means for periodically displacing the relative position between the slit means and the image of the alignment mark, substantially formed at the slit means position, with respect to a displacement axis corresponding to the center line of the slit means; light-receiving means for receiving the light passing through the slit means so as to output discrete electric signals in correspondence with the received light; peak hold means for detecting each of the discrete signals from the light-receiving means to keep the detection value until the input of the next discrete signal; sensor means for detecting the output variation of the light source; correction means for correcting the discrete signal on the basis of the sensor means; filter means for removing a harmonic component from the signal corrected by the correction means; phase detector means for phase-detecting the output of the filter means on the basis of the displacement frequency of the displacing means; and smoothing means for smoothing the output of the phase detector means.

More specifically, the lens system is arranged to enlarge and image the light incident on the alignment mark after emitted from the light source, and the peak hold means detects the total amount of the respective discrete signals to be outputted from the light-receiving means and integrates the detection value which is in turn kept until the input of the next discrete signals, and both of the sensor means and the slit means are in an optical conjugate position relation with respect to the alignment mark. Preferably, the apparatus further comprises second slit means provided at the front side of the sensor means and arranged so that both the second slit means and the first-mentioned slit means are in an optical conjugate position relation with respect to the alignment mark and at least one the light-receiving means and the sensor means is composed of a photodiode and the light-receiving means is substantially coincident in arrangement with the sensor means.

In accordance with the present invention, there is further provided an alignment detection apparatus for detecting the alignment of an object, comprising: a light source for periodically and interruptedly emitting light; an alignment mark provided on the object; a lens system for at least imaging light incident on the alignment mark after emitted from the light source; slit means provided substantially at the imaging position of the lens system; displacing means for periodically displacing the relative position between the slit means and the image of the alignment mark, substantially formed at the slit means position, with respect to a displacement axis corresponding to the center line of the slit means; light-receiving means for receiving the light passing through the slit means so as to output discrete electric signals in correspondence with the received light; peak hold means for detecting each of the discrete signals from the light-receiving means to keep the detection value until the input of the next discrete signal; filter means for removing a harmonic component from the output signal of the peak hold means; phase detector means for phase-detecting the output of the filter means on the basis of the displacement frequency of the displacing means; and smoothing means for smoothing the output of the phase detector means.

BRIEF DESCRIPTION OF THE DRAWINGS

The object of the present invention will become more readily apparent from the following detailed description of the preferred embodiments taken in conjunction with the accompanying drawings in which.

DETAILED DESCRIPTION OF THE INVENTION

Figure 5:
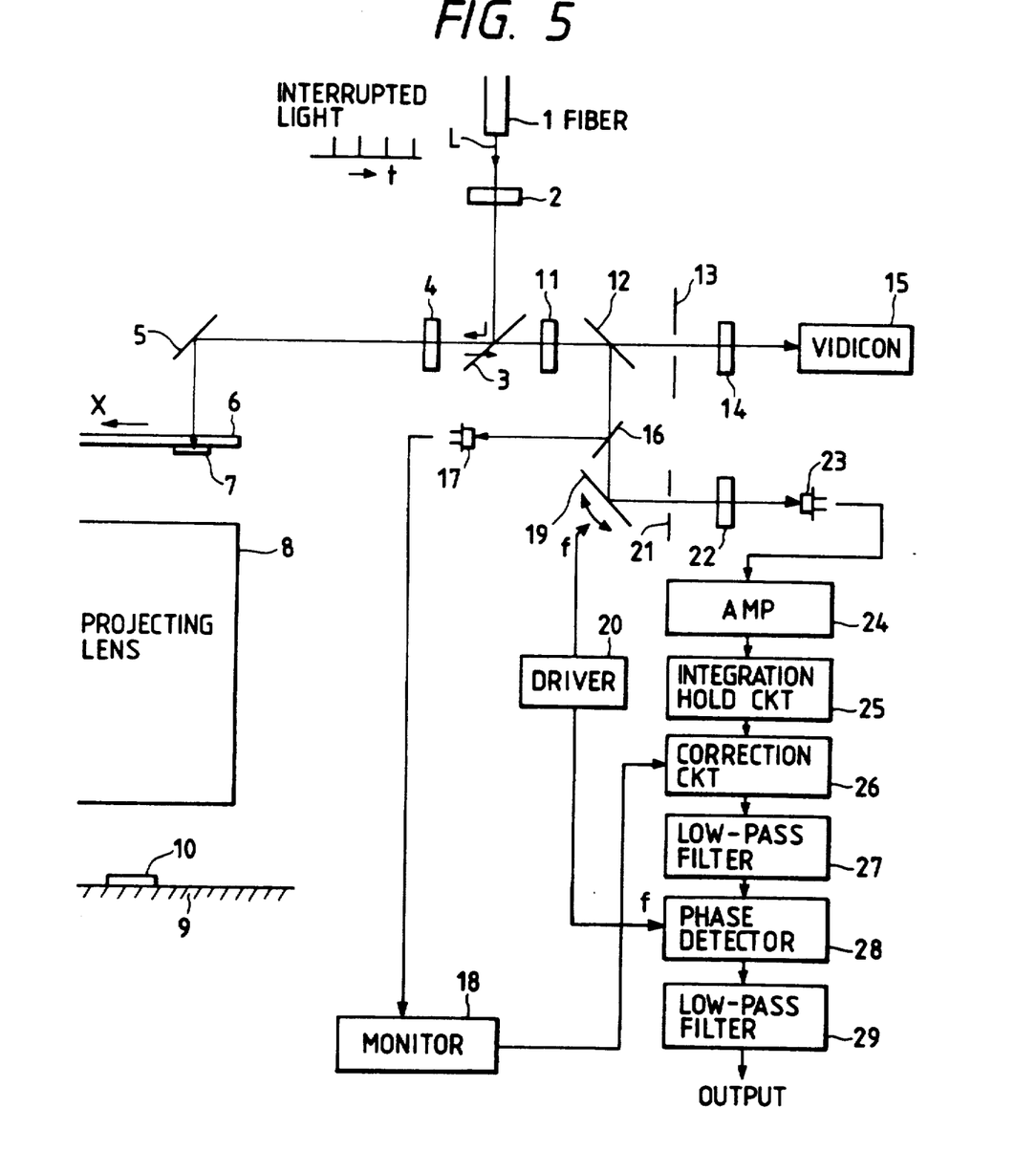
FIG. 5 is a block diagram showing an arrangement of an alignment detection apparatus according to an embodiment of the present invention.

Referring now to FIG. 5, there is illustrated an arrangement of an alignment detection apparatus according to an embodiment of the present invention. A description of this embodiment will be made in the case of applying to the alignment of a reticle. In FIG. 5, illustrated at numeral 1 is a fiber to be coupled to an interruptedly emitting excimer laser, being an exposure light source, so as to project laser light (for example, having the emission pulse width of 20 ns, the repeat frequency of 200 Hz and the output variation of ± about 5%) L from an output port provided at an end portion thereof. A condensing lens 2 condenses the light projected from the fiber 1 to form a light beam. These fiber 1 and condensing lens 2 constitutes a so-called illumination optical system. Numeral 3 represents a beam splitter for separation of light whereby a portion of the light is transmitted and a portion thereof is reflected, and numeral 4 designates an objective lens for enlarging the light incident on an alignment mark on a reticle (which will be described hereinafter), i.e., an image of the alignment mark. Further, numeral 5 is a mirror for reflecting light to change its advancing direction, 6 depicts a reticle corresponding to an enlarged exposure original drawing (mask), and 7 denotes an alignment mark having a stripe-like configuration suitable for the alignment which may be formed at an end portion of the reticle 6, i.e., at a portion that is not used for the exposure pattern. Still further, numeral 8 represents a projecting lens for reducing the exposure light after passing through the reticle 6, 9 designates a wafer stage on which a wafer (not shown) is placed for the exposure, 10 depicts a fiducial mark, 11 denotes an imaging lens for imaging light, 12 indicates a beam splitter having the same structure as the above-mentioned beam splitter, 13 is a target (fixed) mark for easy discrimination of the image, 14 represents a relay lens to be used for imaging, 15 designates a vidicon for image-formation, 16 depicts a beam splitter having the same structure as the above-mentioned beam splitter, 17 denotes a photoelectric conversion light-receiving element for monitoring (detecting) the output variation of the laser light, and 18 is a laser output monitor for detecting the laser light output variation to output a regulation (coefficient of variation) with respect to a reference value. In addition, numeral 19 represents a vibration mirror which vibrates at a given frequency f and with a given amplitude, 20 designates a mirror driver for generating a signal with the given frequency f (f is below about 1/10 of the repeat emission frequency of the excimer laser acting as the alignment light, i.e., f: about 10 to 20 Hz) and the given amplitude to drive the vibration mirror 19, 21 depicts a stripe-like slit having a given width (several tens to several hundreds microns), 22 denotes a condensing lens for converging the light after passed through the slit 21, and 23 indicates a photoelectric conversion light-receiving element such as a PIN photodiode (S1723-05 manufactured by Hamamatsu Photonics Co., Ltd, for example). Moreover, numeral 24 is an amplifier for amplifying the photoelectric conversion signal of the light-receiving element 23, and 25 represents an integration and peak hold circuit for detecting the discrete photoelectric conversion signal due to the interrupted emission wave after passing through the amplifier 24 to integrate the total amount thereof to obtain a peak value and for keeping this peak value for a given time (given period) until the next input of the photoelectric conversion signal. Here, if required to simplify this circuit, it is also appropriate that it is arranged to detect the peak value without integrating the photoelectric conversion signal. Numeral 26 is an output correction circuit for correcting the signal input from the integration and hold circuit 25 in accordance with the output regulation input from the laser output monitor 18, 27 represents a low-pass filter for removing the harmonic component from the pulse train whose amplitude continuously varies so as to extract the fundametal wave component, 28 depicts a phase detector for obtaining and outputting the product of two input signals, and 29 denotes a low-pass filter for smoothing the output of the phase detector 28. Here, if the intensity variation of the emission light of the light source is sufficiently small, it is possible to omit the correction system comprising the light-receiving element 17, laser output monitor 18 and output correction circuit 26.

Figure 6A:
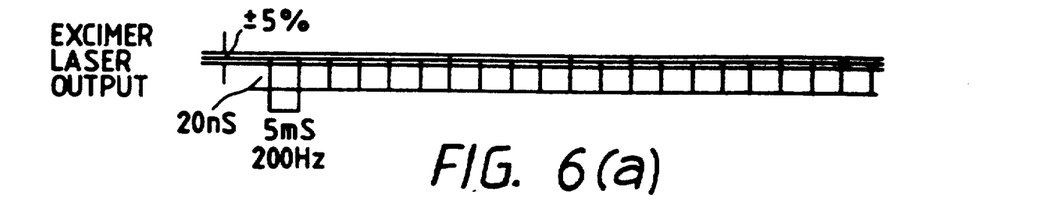
FIGS. 6(a)–(f) are illustrations of signals in the alignment detection apparatus of this embodiment.
Figure 6B:
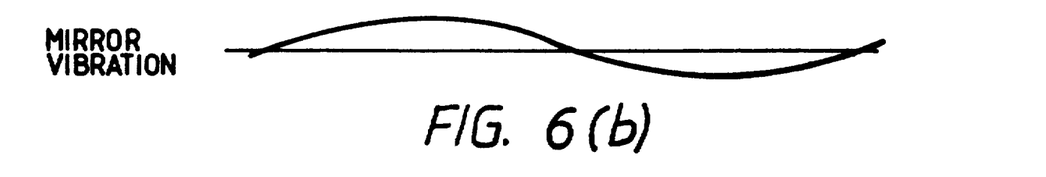
Figure 6C:
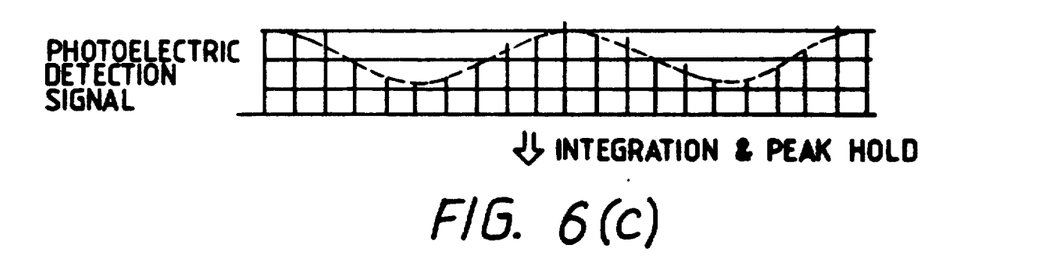
Figure 6D:
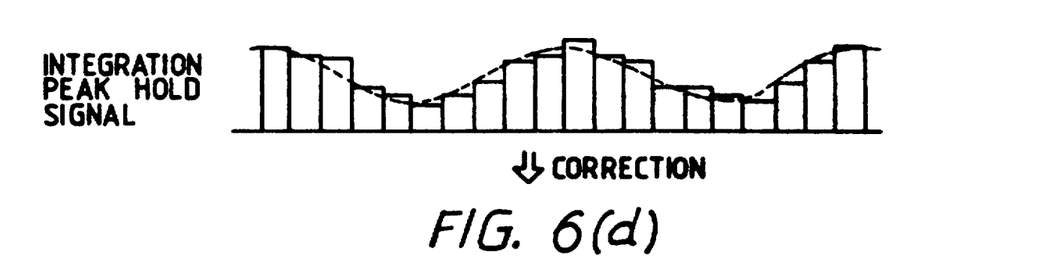
Figure 6E:
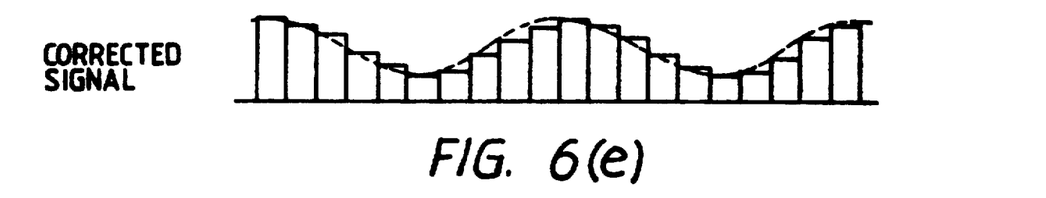
Figure 6F:
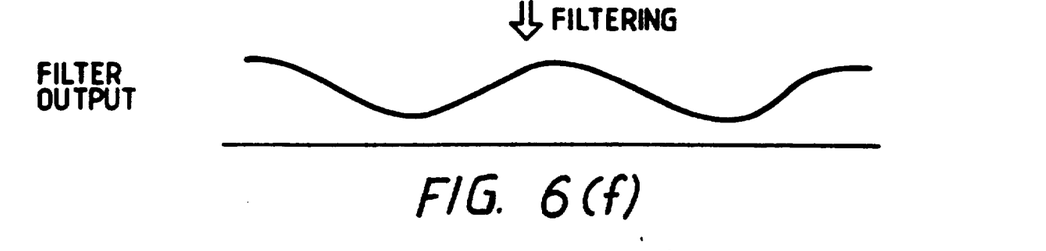
Figure 7:
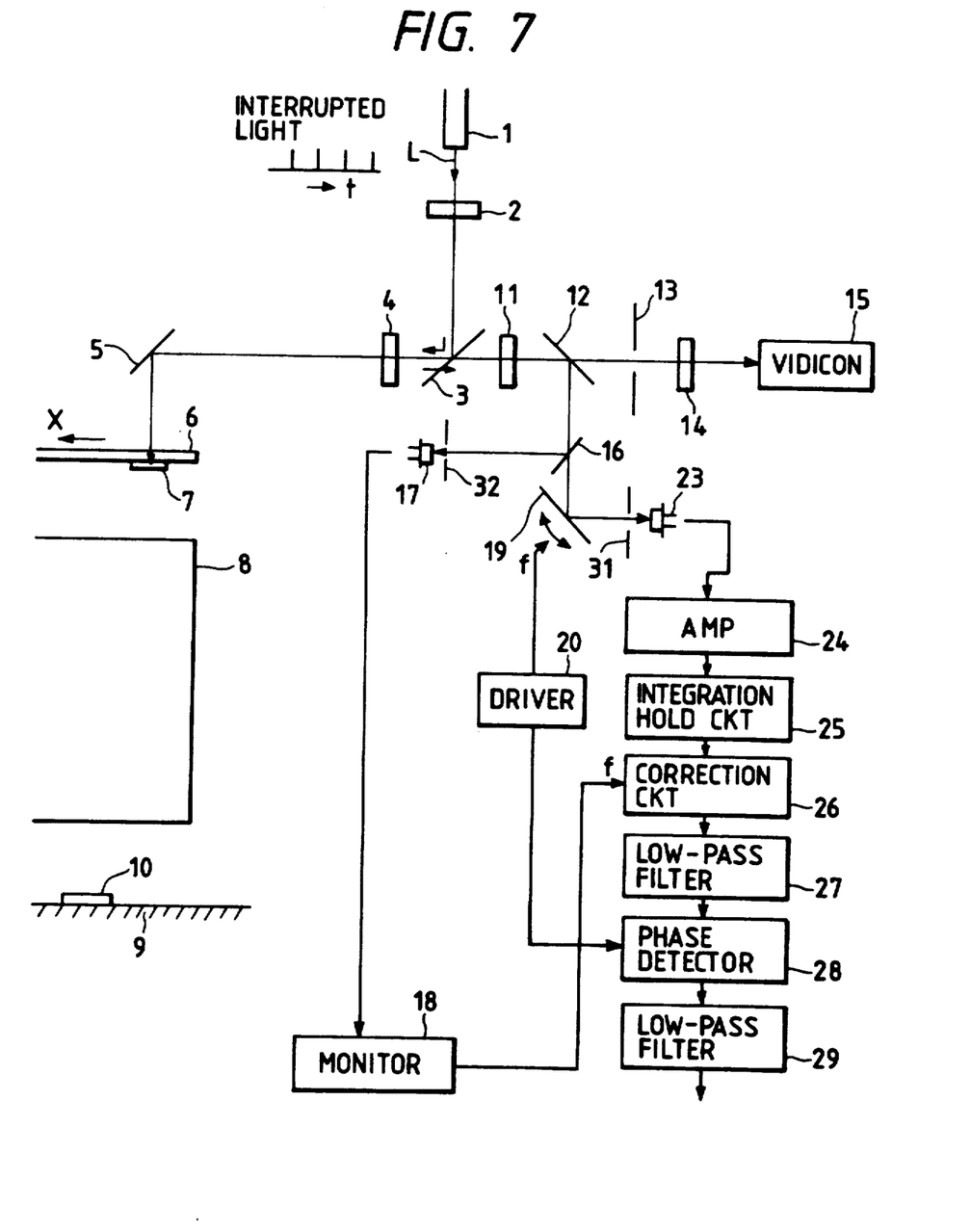
FIG. 7 is an illustration of a modification of the FIG. 5 alignment detection apparatus.

The operation of the apparatus thus arranged will be described hereinbelow. In FIG. 5, the excimer laser, being the exposure light source, projects interruptedly emitting laser light (having the emission pulse width of 20 ns, the repeat frequency of 200 Hz and the output variation of ± about 5% as illustrated by (a) of FIG. 6) through an output port provided at the end portion of the fiber 1. The projected light is converged through the condensing lens 2 and then vertically incident on the reticle 6 by means of the mirror 5 after reflected by the beam splitter 3 and passing through objective lens 4 so as to be reflected by the alignment mark 7. The reflected light therefrom advances along the same path up to the objective lens 4 and then straightforwardly transmits the beam splitter 3 so as to be incident on the beam splitter 12 after passing through the imaging lens 11. Here, the objective lens 4 and image lens 11 are arranged to enlarge and project the reflected light from the alignment mark 7 so that it is imaged at the slit 21. The light incident on the beam splitter 12 is divided into two beams: one passing through the target mark 13 to be projected by the relay lens 14 and received by the vidicon 15. Here, although the image is interrupted at 200 Hz, the human's eyes substantially take it as a continuous image due to the afterimage effect whereby it is possible to use the image as it is for the rough alignment of the reticle 6. The other light beam divided by the beam splitter 12 is further divided by means of the beam splitter 16 into two beams: one being photoelectrically converted by means of the light-receiving element 17 for the laser output monitor 18. Although this monitor light-receiving element 17 can be placed at any position within the optical path of the excimer laser light, for ensuring the accurate alignment, it is preferable that it is placed a position immediately before the vibration mirror 19 and conjugational with respect to the slit 21. Further, it is also appropriate to, before the light-receiving element 17, provide a slit having the same structure as the slit 21 and a condensing lens having the same structure as the condensing lens 22. In the case that the optical system provided before the light-receiving element 23 has the same structure as the optical system provided before the light-receiving element 17, the state of the light to be received by the light-receiving element 23 becomes coincident with the state of the light to be received by the light-receiving element 17 so as to increase the accuracy of the correction. Further, the condensing lens 22 and others are effective for sufficiently ensuring the light intensity in the case that difficulty is encountered to shorten the optical path between the slit and the light-receiving element. As shown in FIG. 7, it is also appropriate to arrange the alignment detection apparatus where slits 31 and 32 are provided before the light-receiving elements 23 and 17, respectively. Still further, if the detector to be used as the monitor light-receiving element 17 is coincident in kind with the detector to be used as the signal light-receiving element 23, it is possible to more accurately perform the correction of the output variation.

As described above, the signal photoelectrically converted by the monitor light-receiving element 17 is inputted to the laser output monitor 18. The laser output monitor 18 includes an amplifier, an integrator, a peak hold circuit, a divider and others so as to amplify and integrate the inputted signal to detect a peak value which is in turn kept until the next signal input, this peak value kept is divided by a predetermined laser output reference value. Thus, the division result means the laser output variation. This laser output variation is supplied to the output correction circuit 26. On the other hand, the other light beam divided by the beam splitter 16 is incident on the vibration mirror 19. The vibration mirror 19 is driven by the mirror driver 20 with the vibration having a predetermined vibration frequency f (f: about 20 Hz). The light reflected by the vibration mirror 19 is incident on the slit 21. The light passing through the slit 21 is converged by means of the condensing lens 22 so as to reach the light-receiving element 23 for the photoelectric conversion. Generally, as the light-receiving element 23 there is used a photomultiplier. The operational principle of the photomultiplier is that the incident light reaches a photoelectric surface to generate photo-electron which in turn strikes wall surfaces of a dynode so as to multiply the electron and reach the anode. Due to the difference of the passage path of the electron when passing through the dynode, the multiplication factor of the electron, i.e., sensitivity, varies. In the case of continuous emission or interrupted emission with a long emission pulse width (above several $\mu$sec), this variation does not provide a problem because of averaging. However, when the emission pulse width is short to be 20 nsec, the use of such a photomultiplier becomes difficult. Thus, in this invention, as the light-receiving element 23 there is used a photodiode having a little sensitivity variation with respect to the interrupted input whose emission pulse width is short. Similarly, a photodiode is used for the monitor light-receiving element 17. Further, in order to increase the correction accuracy, the photodiodes for the light-receiving elements 17 and 23 are arranged to be coincident in item number with each other to obtain the same characteristic.

Figure 8A:
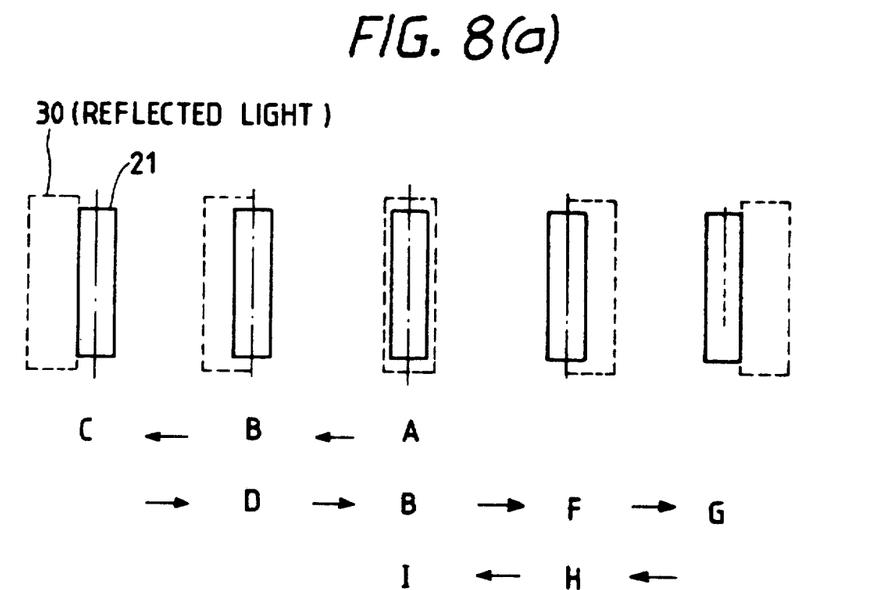
FIGS. 8(a) and (b) are illustrations for describing the position relation between a slit and the imaging light.
Figure 8B:
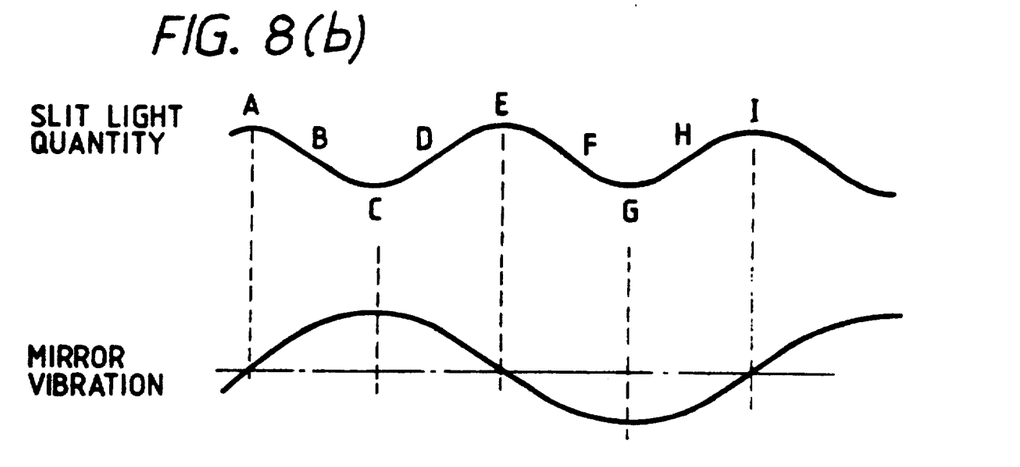

The light incident on the light-receiving element 23 comprising the photodiode is converted into an electric signal. This discrete signal is amplified by the amplifier 24. In the case that the alignment of the reticle 6 is substantially in a desirable state, that is, in the case that the stripe-like light reflected by the stripe-like alignment mark 7 of the reticle 6 is oscillating due to the vibration mirror 19 about the center of the slit 21, when the mirror 19 vibrates as illustrated by (b) of FIG. 6 and as shown in FIG. 8, the light quantity 30 passing through the slit 21 in accordance with the displacement of the mirror 19 varies at a frequency which is twice the vibration frequency of the mirror 19. Thus, in this case, the output wave of the amplifier 24 shown in FIG. 5 becomes as illustrated by (c) in FIG. 6.

Secondly, the discrete signal from the amplifier 24 is inputted to the integration and peak hold circuit 25 so that each of the inputted discrete signals is integrated to detect the peak whose value is kept until the next signal input. The output signal of the integration and peak hold circuit 25 becomes as shown by (d) of FIG. 6 and is inputted to the output correction circuit 26. The output correction circuit 26 takes the product of the output of the integration and peak hold circuit 25 and the laser output variation to be outputted from the laser output monitor 18 and outputs the product. That is, the output variation is corrected and the correction result is outputted. The correction output signal is as shown by (e) of FIG. 6. Here, since the object light of the output variation (value) to be outputted from the laser output monitor 18 is the same as the object light of the signal to be outputted from the integration and peak hold circuit 25, the correction processes in the output correction circuit 26 are simultaneously performed at the real time. Thereafter, the output signal of the output correction circuit 26 is inputted to the low-pass filter 27. Since the low-pass filter 27 uses as the cut-off frequency a frequency which is about twice the vibration frequency f of the vibration mirror 19, the harmonic component is removed from the corrected stepwise signal, thereby providing a signal formed by a smooth fundamental wave component as illustrated by (f) of FIG. 6 (This signal is substantially equal to the output of the amplifier 120 of the conventional apparatus including a continuous emission light source as shown in FIG. 1).

The above-mentioned vibration mirror 19 is provided with a sensor (not shown) to detect the amplitude of the vibration mirror 19. This sensor output is feedbacked to the mirror driver 20 so as to perform the closed loop control to improve the accuracy of the vibration frequency and the amplitude. The signal obtained by amplifying the sensor signal in the mirror driver 20 is outputted to the phase detector 28. The phase detector 28 takes the product (phase detection) of the output signal of the low-pass filter 27 and the sensor signal outputted from the mirror driver 20 to output the result to the low-pass filter 29. The low-pass filter 29 effects the smoothing and averaging of the input signal to output the result as a so-called phase detection output. When in the above-described alignment system the moving amount of the reticle 6 in the X-direction is taken on the horizontal axis and the phase detection output is taken on the vertical axis, it is possible to obtain the characteristic as illustrated in FIG. 4, that is, it is possible to obtain the characteristic similar to that of the conventional apparatus. Although the above description has been made in terms of the alignment sensing system of the reticle 6 in the X-direction, it is also possible to similarly perform the alignment sensing in the Y- and θ-direction.

Although in the above description the slit 21 is arranged to be fixed and the mirror 19 is arranged to vibrate, it is appropriate that the mirror 19 is arranged to be fixed and the slit 21 is arranged to vibrate at the frequency f. Further, although this invention is made so as to detect the shifting amount of the reflected light from the stripe-like alignment mark 7 with respect to the center of the slit 21 and in this embodiment it is applied to the alignment of the reticle 6, it is also appropriate to apply it to the alignment of a wafer on which the stripe-like alignment mark is provided. In addition, since in the exposure device using the excimer laser as the exposure light source the wavelength of the light to be used for the alignment is coincident with the exposure light wavelength, it is also possible to directly detect the shifting amount of the alignment mark on the wafer through the projecting lens 8. Moreover, it is also appropriate to be arranged such that, after passing through the stripe-like alignment mark 7 of the reticle 6, the light passes through the projecting lens and is then reflected by the fiducial mark 10 on the wafer stage 9, and the reflected light advances along the same path so as to reach the light-receiving element. In this case, it is also possible to perform the absolute alignment of the reticle 6 with respect to the fiducial mark 10.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention.

What is claimed is:

1. An alignment detection apparatus for detecting the alignment of an object, comprising:
   a light source for periodically and interruptedly emitting light, the output of said light source varying in a predetermined range;
   an alignment mark provided on said object;
   a lens system for at least imaging light incident on said alignment mark after emitted from said light source;
   slit means provided substantially at the imaging position of said lens system;
   displacing means for periodically displacing the relative position between said slit means and the image of said alignment mark, substantially formed at the slit means position, with respect to a displacement axis corresponding to the center line of said slit means;
   light-receiving means for receiving the light passing through said slit means so as to output discrete electric signals in correspondence with the received light;
   peak hold means for detecting each of the discrete signals from said light-receiving means to keep the detection value until the input of the next discrete signal;
   sensor means for detecting the output variation of said light source;
   correction means for correcting the discrete signal on the basis of said sensor means;
   filter means for removing a harmonic component from the signal corrected by said correction means;
   phase detector means for phase-detecting the output of said filter means on the basis of the displacement frequency of said displacing means; and
   smoothing means for smoothing the output of said phase detector means.

2. An alignment detection apparatus as claimed in claim 1, wherein said lens system is arranged to enlarge and image the light incident on said alignment mark after emitted from said light source.

3. An alignment detection apparatus as claimed in claim 1, wherein said peak hold means detects the total amount of the respective discrete signals to be outputted from said light-receiving means and integrates the detection value which is in turn kept until the input of the next discrete signal.

4. An alignment detection apparatus as claimed in claim 1, wherein both said sensor means and said slit means are in an optical conjugate position relation with respect to said alignment mark.

5. An alignment detection apparatus as claimed in claim 1, further comprising second slit means provided at the front side of said sensor means and arranged so that both said second slit means and the first-mentioned slit means are in an optical conjugate position relation with respect to said alignment mark.

6. An alignment detection apparatus as claimed in claim 1, wherein at least one said light-receiving means and said sensor means is composed of a photodiode.

7. An alignment detection apparatus as claimed in claim 1, wherein said light-receiving means is substantially coincident in arrangement with said sensor means.

8. An alignment detection apparatus as claimed in claim 1, wherein said light source is composed of an excimer laser.

9. An alignment detection apparatus for detecting the alignment of an object, comprising:

a light source for periodically and interruptedly emitting light;

an alignment mark provided on said object;

a lens system for at least imaging light incident on said alignment mark after emitted from said light source;

slit means provided substantially at the imaging position of said lens system;

displacing means for periodically displacing the relative position between said slit means and the image of said alignment mark, substantially formed at the slit means position, with respect to a displacement axis corresponding to the center line of said slit means;

light-receiving means for receiving the light passing through said slit means so as to output discrete electric signals in correspondence with the received light;

peak hold means for detecting each of the discrete signals from said light-receiving means to keep the detection value until the input of the next discrete signal;

filter means for removing a harmonic component from the output signal of said peak hold means;

phase detector means for phase-detecting the output of said filter means on the basis of the displacement frequency of said displacing means; and smoothing means for smoothing the output of said phase detector means.

10. An alignment detection apparatus as claimed in claim 9, wherein said lens system is arranged to enlarge and image the light incident on said alignment mark after emitted from said light source.

11. An alignment detection apparatus as claimed in claim 9, wherein said peak hold means detects the total amount of the respective discrete signals to be outputted from said light-receiving means and integrates the detection value which is in turn kept until the input of the next discrete signal.

12. An alignment detection apparatus as claimed in claim 9, wherein said light-receiving means is composed of a photodiode.

* * * * *